United States Patent [19]
Jones

[11] Patent Number: 5,307,806
[45] Date of Patent: May 3, 1994

[54] NMR PELVIC COIL

[75] Inventor: Randall W. Jones, Elkhorn, Nebr.

[73] Assignee: Board of Regents of Univ. of Nebraska, Lincoln, Nebr.

[21] Appl. No.: 105,492

[22] Filed: Aug. 10, 1993

[51] Int. Cl.⁵ ............................................. A61B 5/055
[52] U.S. Cl. ................................... 128/653.5; 324/318
[58] Field of Search ........................ 128/653.2, 653.5; 324/318, 322

[56] References Cited

U.S. PATENT DOCUMENTS 5,136,244  8/1992  Jones et al. ...................... 128/653.5

*Primary Examiner*—Ruth S. Smith
*Attorney, Agent, or Firm*—Zarley, McKee, Thomte, Voorhees & Sease

[57] ABSTRACT

A NMR pelvic coil includes an anterior housing with a support arm projecting rearwardly therefrom, and a posterior housing with a base arm projecting rearwardly therefrom, the two housings pivotally connected at the rearward ends of their respective support and base arms, for pivotal movement towards and away from one another. The anterior and posterior housings each support a plurality of NMR coils, and are curved from side edge to side edge towards one another to closely conform to the patient anatomy as well as the curvature of the patient table. An adjustment bar is pivotally connected to the base arm and extends upwardly and through an aperture in the support arm, and includes teeth thereon so as to selectively engage the support arm to hold the anterior housing in the desired position relative to the posterior housing.

5 Claims, 2 Drawing Sheets

NMR PELVIC COIL

TECHNICAL FIELD

The present invention relates generally to magnetic resonance imaging (MRI) and more particularly to local coils for use in receiving MRI signals.

BACKGROUND OF THE INVENTION

Nuclear magnetic resonance (NMR) refers generally to one form of gyromagnetic spectroscopy which is conducted to study nuclei that have magnetic moments. Any nucleus which possesses magnetic moment attempts to align itself with the direction of the magnetic field in which it is located. The nucleus precesses around the direction of the magnetic field at a characteristic angular frequency known as the Larmor frequency. The Larmor frequency is dependent upon the strength of the magnetic field and on the properties of the specific nuclear species.

Subjecting human tissue to a uniform magnetic field will cause the individual magnetic moments of the paramagnetic nuclei in the tissue to attempt to align with this magnetic field, but will precess about it in random order at their characteristic Larmor frequency. If the tissue is irradiated with a magnetic field (excitation field $B_1$) which is in the perpendicular plane relative to the direction of the polarizing field $B_z$, and which is near the Larmor frequency, the net aligned moment $M_z$, can be rotated into the perpendicular plane (x-y plane) to produce a net transverse magnetic moment $M_1$ which is rotated in the x-y plane at the Larmor frequency. Once the magnetic field (excitation field $B_1$) is terminated, an oscillating sine wave (referred to as an NMR signal) is induced in a receiving coil by the rotating field produced by the transverse magnetic moment $M_1$. The frequency of the signal is the Larmor frequency, and its magnitude is determined by the magnitude of $M_1$.

A weak nuclear magnetic resonance generated by the precessing nuclei may be sensed by an RF coil and recorded as an NMR signal. From this NMR signal, a slice image may be derived according to well known reconstruction techniques. The quality of the image produced by the MRI techniques is dependent, in part, on the strength of the NMR signal received from the precessing nuclei. For this reason, an independent RF receiving coil is placed in close proximity to the region of interest of the imaged object to improve the strength of this received signal. Such coils are referred to as "local coils" or "surface coils".

"Whole body" NMR scanners are sufficiently large to receive an entire human body, and to produce an image of any portion thereof. Such whole body scanners may employ an excitation coil for producing the excitation field and a separate receiver coil for receiving the NMR signal. The excitation coil produces a highly uniform excitation field throughout the entire area of interest, whereas the receiver coil is placed near the immediate area of interest to receive the NMR signal.

The smaller area of the local coils permit them to accurately focus on NMR signal from the region of interest. The smaller size of the local coil makes it important that the local coil be accurately positioned near the region of interest. For "whole volume" coils, employing two antenna loops to receive the NMR signal from a volume defined between the loops, accurate positioning of the coils is particularly important. This leads to the development of local coils which conform to the anatomy of interest, yet function to permit ease of use.

SUMMARY OF THE INVENTION

It is therefore an object of the present invention to provide an improved NMR local coil designed to conform to a patient's pelvic region on a variety of patient sizes.

Yet another object is to provide an NMR local coil which is operable to permit ease of patient entrance into the coil set.

Still another object of the present invention is to provide an NMR local coil with a coil form geometry which has been formed to facilitate close coupling of the imaging coil's region of sensitivity to the pelvic region of a patient, and more particularly in the deep seeded internal structures medial of the hip joints, such as the prostrate glad.

These and other objects will be apparent to those skilled in the art.

The NMR pelvic coil of the present invention includes an anterior housing with a support arm projecting rearwardly therefrom, and a posterior housing with a base arm projecting rearwardly therefrom, the two housings pivotally connected at the rearward ends of their respective support and base arms, for pivotal movement towards and away from one another. The anterior and posterior housings each support a plurality of NMR coils, and are curved from side edge to side edge towards one another to closely conform to the patient anatomy as well as the curvature of the patient table. The anterior housing support arm includes a generally horizontal forward portion and an angled portion extending downwardly and rearwardly from the forward portion to connect the support arm to the base arm. An adjustment bar is pivotally connected to the base arm and extends upwardly and through an aperture in the angled portion of the support arm, and includes teeth thereon so as to selectively engage the support arm to hold the anterior housing in the desired position relative to the posterior housing. An operable lock mechanism is mounted on the support arm to lock the engagement of the adjustment bar with the support arm, to selectively position the anterior housing relative to the posterior housing.

DESCRIPTION OF THE PREFERRED EMBODIMENT

Figure 1:
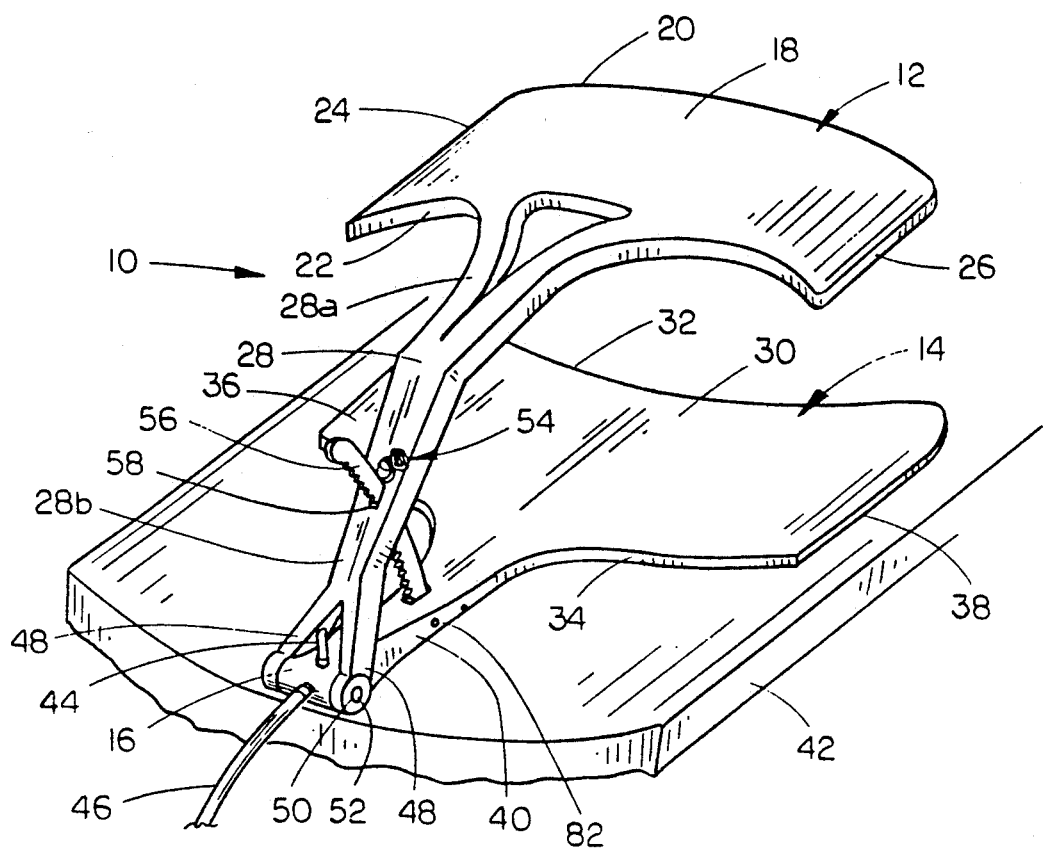
FIG. 1 is a perspective view of the NMR pelvic coil array of the present invention.

Referring now to the drawings, in which similar or corresponding parts are identified with the same reference numeral, and more particularly to FIG. 1, the NMR local coil of the present invention is designated generally at 10 and is designed for conformation to the anatomy of the pelvic region of a patient. The pelvic coil array 10 includes an anterior segment 12 mechanically pivotally connected to a posterior segment 14 for selectively adjustable pivotal movement about a hinge 16.

Anterior segment 12 includes a plurality of electronic NMR coils enclosed within a durable plastic housing 18. Housing 18 includes a forward edge 20, a rearward edge 22, and opposing side edges 24 and 26. A support arm 28 is affixed to the rearward edge 22 of housing 18 and extends rearwardly and downwardly therefrom to hinge 16.

Posterior segment 14 also includes a plurality of electronic NMR coils enclosed within a durable plastic housing 30. Housing 30 includes a forward edge 32, rearward edge 34 and opposing side edges 36 and 38 respectively. A base arm 40 is mounted to the rearward edge 34 of housing 30 and extends rearwardly therefrom to hinge 16.

Posterior segment 14 is curved from side edge 36 to side edge 38 to conform to the curvature of the patient table 42. Anterior segment 12 is also curved from side edge 24 to side edge 26 in an opposite direction of the curvature of posterior segment 14, to closely conform to the curvature of the patient's anatomy.

Extension arm 28 and base arm 40 are preferably relatively narrow in width compared to the transverse width of segments 12 and 14, to assist in positioning a patient within coil 10. The patient lies supine, with the buttock resting on posterior segment 14 and the legs straddling extension arm 28, with the pelvic region located between anterior segment 12 and posterior segment 14.

The electronic coils within housing 18 are electrically connected to the NMR equipment via an electrical cable 44 extending from housing 18 within extension arm 28, downwardly into base arm 40 and thence through a main electrical cable 46. Electronic coils within housing 30 are routed directly through base arm 40 and thence through main cable 46.

In the preferred embodiment of the invention, extension arm 28 includes a generally horizontal portion 28a which extends rearwardly from housing 18, and an angled portion 28b which extends upwardly and forwardly from hinge 16 to the rearward end of horizontal portion 28a. The lower end of angled portion 28b of extension arm 28 has a pair of diverging legs 48 extending downwardly therefrom, with a pair of coaxial apertures 50 formed in the lower end thereof. A pivot pin 52 extends through apertures 50, and serves as the pivotal axis for extension arm 28 on legs 48. Pivot pin 52 extends through the rearward end of base arm 40 to permit pivotal movement of anterior segment 12 relative to posterior segment 14.

Figure 3:
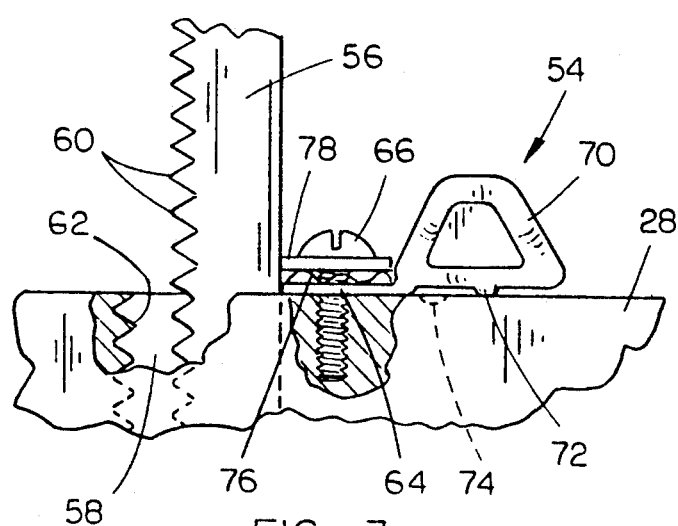
FIG. 3 is a partial side elevational view of the adjustment bar lock and mechanism of FIG. 2.

The height of anterior segment 12 above posterior segment 14 is selectively adjusted by operating a lock mechanism 54 on extension arm 28 so as to engage an adjustment bar 56. Adjustment bar 56 is oriented generally vertically and angled slightly rearwardly, and projects upward from base arm 40 and thence through a vertically oriented aperture 58 in extension arm 28. As shown in FIG. 3, adjustment bar 56 has a plurality of teeth 60 formed along the rearward vertical edge thereof which are designed to selectively engage a set of forwardly projecting teeth 62 formed in the upper end of aperture 58, as shown in FIG. 3. Thus, vertical movement of extension arm 28 may be selectively restrained by engagement of the adjustment bar teeth 60 with teeth 62.

Figure 2:
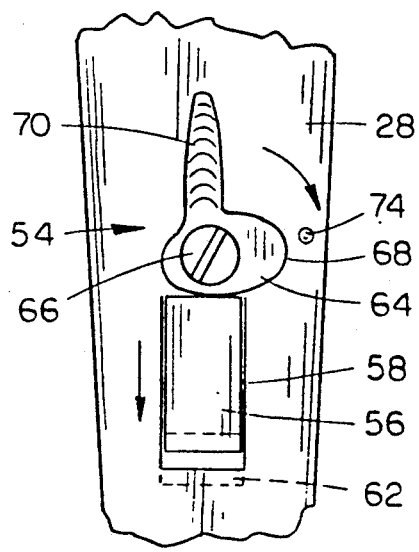
FIG. 2 is an enlarged partial top plan view of the adjustment bar lock and mechanism.

Locking mechanism 54 is designed to selectively engage adjustment bar teeth 60 with teeth 62. Mechanism 54 includes a generally elliptical cam plate 64 which is eccentrically and pivotally mounted on a screw 66 threaded into extension arm 28, as shown in FIG. 2. Pivotal movement of cam plate 64 about screw 66 will move a cam surface 68 (formed along an edge of cam plate 64) between the disengaged position shown in FIG. 2 to an engaged position. In the engaged position cam surface 68 forces adjustment bar 56 rearwardly within aperture 58 such that adjustment bar teeth 60 engage teeth 62.

A vertically oriented thumb grip 70 is mounted to cam plate 64, which is easily gripped so as to pivot cam plate 64 on screw 66. A small peg 72 depends from the bottom of grip 70 and will engage a dimple 74 located in the top surface of extension arm 28, to retain cam plate 64 in the engaged position. A spring 76 is mounted on the screw shank above cam plate 64 and under a washer 78 to provide a downwardly biasing force on cam plate 64 and grip 70, so as to positively engage peg 72 in dimple 74.

Figure 4:
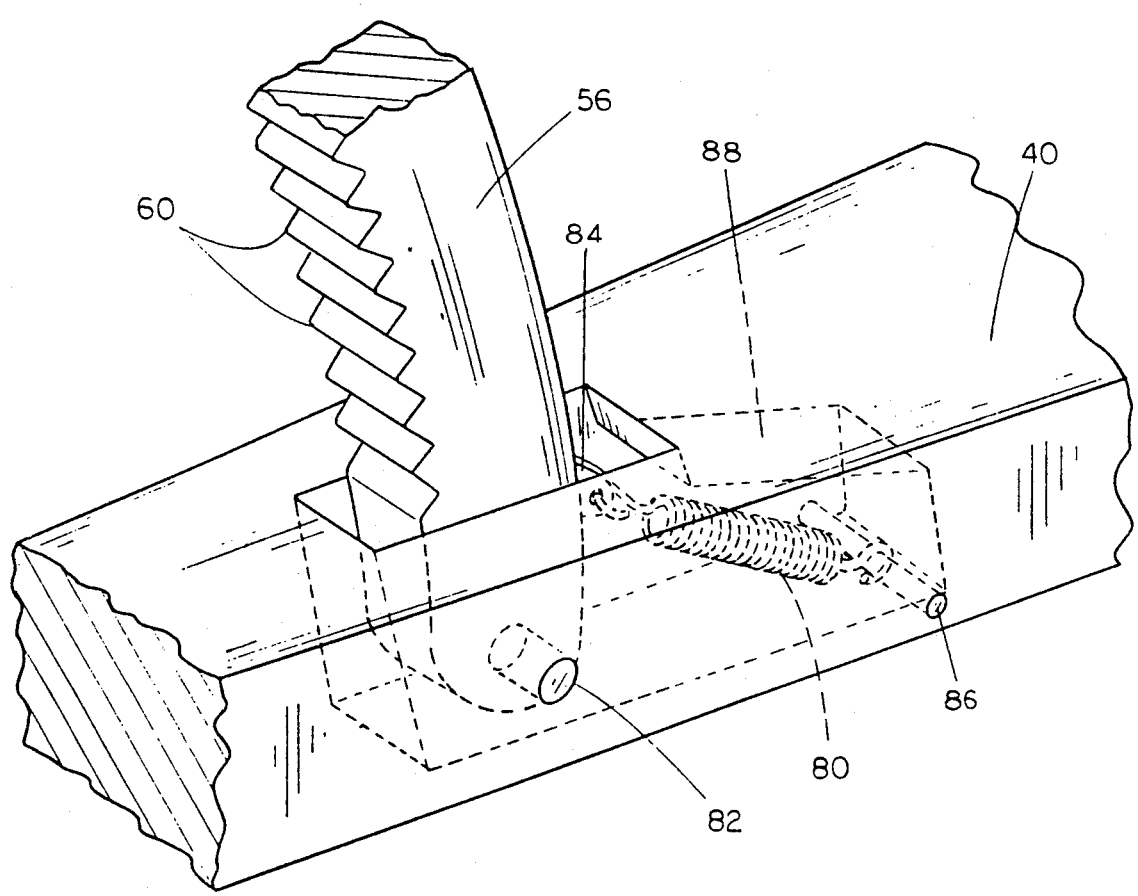
FIG. 4 is an enlarged partial perspective view of the connection of the adjustment bar to the base arm of the posterior segment.

Referring now to FIG. 4, the lower end of adjustment bar 56 is pivotally connected to base arm 40 via hinge pin 82. A spring 80 extends from a securement flange 84 on adjustment bar 56 to a pin 86 mounted within a chamber 88 in base arm 40, to provide a forwardly biasing force on adjustment bar 56. As described above, lock mechanism 54 (as shown in FIGS. 2 and 3) is utilized to overcome the biasing force of spring 80 (FIG. 4) so as to engage adjustment bar teeth 60 with teeth 62, as shown in FIG. 3.

In operation, pelvic coil array 10 is opened to its greatest extent with anterior segment 12 moved to its uppermost position along adjustment bar 56. Once a patient is positioned between anterior and posterior segments 12 and 14, anterior segment 12 is lowered into place just above the patient's pelvic region. Ring 74 is then pivoted to engage peg 72 in dimple 74 so as to lock adjustment bar teeth 60 on teeth 62 and retain anterior segment 12 in the desired position closely adjacent the patient. The biasing force of spring 76 is overcome in order to release lock mechanism 54 thereby permitting opening coil 10.

Whereas the invention has been shown and described in connection with the preferred embodiment thereof, it will be understood that many modifications, substitutions and additions may be made which are within the intended broad scope of the appended claims. There has therefore been shown and described an improved NMR local coil for the pelvic region which accomplishes at least all of the above stated objects.

I claim:

1. A pelvic coil, comprising:
    an anterior housing supporting a plurality of NMR coils, having a forward edge, a rearward edge, opposing side edges, upper and lower surfaces, and a support arm projecting rearwardly from the rearward edge;
    a posterior housing supporting a plurality of NMR coils having a forward edge, rearward edge, opposing side edges, upper and lower surfaces, and a rearwardly projecting base arm, pivotally connected at a rearward end of the base arm to a rearward end of the support arm, for pivotal movement of the anterior and posterior housings towards and away from one another;
    said support arm including a forward, generally horizontal portion extending along a generally horizontal central axis of said anterior housing, and an angled portion sloped downwardly from the forward portion to the pivotal connection with said base arm, such that a central axis through said posterior housing is substantially parallel to the anterior housing central axis when the anterior and posterior housings are pivoted to a working position; and means on said base arm and support arm for selectively locking the pivotal position of said anterior housing relative to the posterior housing.

2. The pelvic coil of claim 1, wherein said posterior housing is curved upwardly from side edge to side edge to conform to the curvature of a conventional NMR patient table.

3. The pelvic oil of claim 2, wherein said anterior housing is curved downwardly from side edge to side edge, generally opposed to the curvature of the posterior housing, to closely conform to the curvature of a patient's anatomy.

4. The pelvic coil of claim 1, wherein said selective locking means includes an adjustment bar connected at a lower end to said base arm and projecting upwardly therefrom adjacent the angled portion of said support arm, said support arm including means for selectively engaging said adjustment bar along its length, so as to selectively adjust the distance between the anterior and posterior housings.

5. The pelvic coil of claim 4, wherein said selective locking means further includes an operable lock mechanism for selectively locking said engaging means to lock the anterior and posterior housings in a selected position.

* * * * *